(12) United States Patent
Stoltz et al.

(10) Patent No.: US 6,222,865 B1
(45) Date of Patent: Apr. 24, 2001

(54) LASER DIODE OF THE TYPE HAVING A BURIED HETEROSTRUCTURE

(75) Inventors: Björn Stoltz; Olof Sahlén, both of Stockholm; Ulf Öhlander, Bromma, all of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/108,971

(22) Filed: Jul. 2, 1998

(30) Foreign Application Priority Data

Jul. 4, 1997 (SE) .................................................. 9702629

(51) Int. Cl.$^7$ ...................................................... H01S 5/223
(52) U.S. Cl. ................................................................ 372/46
(58) Field of Search ................................................. 372/46

(56) References Cited

U.S. PATENT DOCUMENTS

| 4,752,933 | 6/1988 | Uomi et al. | 372/46 |
| 5,034,954 | 7/1991 | Seiwa | 372/45 |
| 5,179,040 | 1/1993 | Hattori | 437/129 |
| 5,398,255 | 3/1995 | Terakado | 372/46 |
| 5,847,415 | * 12/1998 | Sakata | 372/46 |

* cited by examiner

*Primary Examiner*—James W. Davie
(74) *Attorney, Agent, or Firm*—Burns, Doane, Swecker & Mathis, L.L.P.

(57) ABSTRACT

In a semiconductor laser of the BH-type comprising a lateral current blocking structure which is constituted of an n-p-n-p- or n-SI-n-p-sequence of layers, located on both sides of a buried active region, one or more thin layers are inserted between the second n-doped layer and the second p-doped layer. The thin, extra layers are p-doped and consist of alternatingly materials having a high bandgap and a low bandgap. These thin layers provide a larger forward voltage drop at moderate to high current densities and thereby give a better current confinement in the laser, what in turn gives a higher optical output power and a smaller deviation of the output power/current characteristic thereof from a linear behavior.

6 Claims, 5 Drawing Sheets

LASER DIODE OF THE TYPE HAVING A BURIED HETEROSTRUCTURE

BACKGROUND

Semiconductor laser diodes, manufactured in material systems including atoms found in groups III–V of the periodic system, such as the material systems InP/InGaAsP, InP/InAlGaAs, GaAs/AlGaAs and GaAs/InGaAs, are key components in most fiber optical communication systems. In system applications it is important to have access to lasers having a high optical output power (a high quantum efficiency) and a linear optical output power (P) as a function of injected current (I). A condition of achieving these objects is that an efficient current confinement exists in the laser structure, i.e., that the leakage currents are as small as possible. Current leakage results in a lower quantum efficiency and a curved, thus non-linear, power-current-(P-I)-characteristic.

One of the most common types of semiconductor lasers is the so called BH-laser where BH stands for Buried Heterostructure. A conventional BH-laser is typically constructed as appears from the schematic cross-sectional view in FIG. 1. The cross-section is taken perpendicularly to the propagation direction of light. In the centre of the laser an active region 1 is provided, here assumed to be made of InGaAsP, which at all of its sides is surrounded by a material having a higher bandgap, which in FIG. 1 is assumed to be InP. At the top and bottom portions layers are provided having the opposite type of doping, in FIG. 1 a p-doped InP-layer above the active region 1 and an n-doped layer 5 under the active region 1, respectively. At the sides of the active region 1, at the right and the left hand side thereof, current blocking areas 7 or current blocking layers are provided, also having a higher bandgap than that of the active region 1. At the very top and at the very bottom of the structure ohmic electrical contacts of metal type are provided, not shown, in order to accomplish current injection for operating the laser.

When a suitable current passes through the active region 1, thus, stimulated recombination is obtained in the active region 1, which is surrounded by materials having higher bandgaps. As has already been described, according to the embodiment of FIG. 1, the material above the active region 1 is p-doped, the material under the active region 1 is n-doped, whereas the material in the active region 1 itself usually is non-doped or low-doped. The structure is thus, as viewed in the direction from the top downwards, a PIN-diode in the cross-section I—I, which is perpendicular to the plane of the paper in FIG. 1 and passes centrally through the active region 1. Two reasons exist for confining or burying the active region 1 in materials having higher bandgaps:

1) In order to achieve a current confinement, since the potential energy for injected charge carriers is lower in the active region 1 than in the surrounding layers having higher bandgaps.

2) In order to obtain an optical confinement, since the active region 1 having a small bandgap has a higher refractive index than the surrounding materials having larger bandgaps, so that the active region 1 forms the core of an optical waveguide, the cladding of which is constituted by the surrounding layers.

When a voltage is applied between the exterior electrical contact, not shown, which is connected to the top p-layer 3, and the other exterior electric contact, not shown, which is connected to the bottom layer 5, so that the top layer obtains a higher potential than the lower layers, current will pass through the structure in a direction downwards. Charge carriers, i.e., holes and electrons, are then injected into the active region 1. They recombine both by spontaneous recombination and by stimulated recombination. For a certain lowest current, called the threshold current $I_{th}$, the stimulated gain is so large that it exceeds the losses in the laser cavity which result from coupling of light out through the end facets, dispersion of light against imperfections in the waveguide and absorption of light, absorption of free carriers, and other factors. The component will then start lasing and light is emitted therefrom.

The optical output power P as a function of the electric current I through the laser then looks ideally as is illustrated by the curve A in FIG. 2 describing an optical output power increasing linearly dependent on the increase of the current. However, substantially two physical phenomena result in that instead the characteristic often appears as is illustrated by the curve B in FIG. 2, i.e., comprising a curved characteristic, in which the optical output power increases less than linearly as a function of the increase of current from the threshold current $I_{th}$:

1) That the chip is heated, i.e., a high temperature exists in the semiconducting plate, in which the laser is made.

2) Leakage currents dependent on the current (or the voltage).

The heating is proportional to V·1, where V is the electrical voltage drop over the diode and I is the intensity of the electric current through the diode. This thermal effect can be minimized by arranging a good thermal dissipation. The second physical phenomena is heavily dependent on the way how the current blocking layers 7 are configured which surround the active region 1 at the left and the right in FIG. 1.

In U.S. Pat. No. 5,398,255, "Semiconductor laser having buried structure on p-InP-substrate" for Tomoji Terakado, NEC Corporation, a laser of the type described above is disclosed. In this patent the introduction of one or more thin layers having a lower bandgap in the current blocking structure is discussed. The laser is built on a p-InP-substrate comprising a sequence of layers placed thereon in the current blocking region in a direction upwards, including first a p-InP-layer 11, which belongs to the lower cladding of the waveguide, thereafter a p-InP-layer 17, further an n-InP-layer 18, an InGaAsP-layer 20, an n-InP-layer 21, and at the top an additional n-InP-layer 22 which belongs to the upper cladding. Thus the InGaAsP-layer is located at the last pn-junction in the general p-n-p-n-structure as seen in a direction from the bottom and upwards.

In U.S. Pat. No. 4,752,933, "Semiconductor laser" for Uomi et al., Hitachi Ltd., a semiconductor laser built from GaAlAs on n-or p-GaAs is disclosed. It has lowered refractive index regions 13 formed by disordering a superlattice structure by means of diffusing Zn or implanting ions of Be or Si. A current blocking layer is formed by a p-n inverse junction between a lower cladding layer 3 and the disordered regions.

SUMMARY

It is an object of the invention to provide a semiconducting laser diode of the BH-type which has reduced leakage currents in order to make it more suited to be used in different communication systems.

It is a further object of the invention to provide a semiconducting laser diode of BH-type which has an increased forward voltage drop in the current blocking structure and which can be produced in a simple way.

The known current blocking structure in a semiconductor laser of BH-type comprising, e.g., an n-p-n-p-sequence of layers incorporated in the structure is supplemented with one of more thin, extra or additional layers, which is or are respectively placed between the second n-doped layer and the second p-doped layer. The thin, extra layers should be p-doped and consist of alternatingly materials having a higher bandgap and a lower bandgap. These thin layers result in a better current confinement of the laser.

The basic technology of manufacturing BH-lasers in the material systems mentioned above is well known. The change in the manufacturing process which is required for introducing the thin layers in the current confinement structure does not imply that any fundamentally new processing methods need to be developed, but the manufacture of the thin layers can be made by means of known process technique, such as MOVPE ("Metal Organic Vapour Phase Epitaxy") or LPE ("Liquid Phase Epitaxy") for growing layers having different bandgaps and dopings, and wet etching or dry etching methods for removing material, possibly selectively in regard of material and/or over definite, lithographically defined areas.

Laser diodes of the buried heterostructure type as discussed herein, having an improved current confinement according to what has been described above allow a higher output power and provide a more linear output power characteristic compared to conventional BH-lasers, in particular at higher temperatures. These characteristics are important for uncooled lasers intended for low cost applications.

The structure described above for current confinement differs in important aspects from the known structure disclosed in the cited U.S. Patent for Terakado:

(1) The structure as described herein for current confinement in lasers primarily refers to lasers manufactured on an n-substrate and not as in the previously known case for lasers manufactured on p-substrates. However, the structure as described herein for current confinement will in principle also work for lasers built on p-substrates; in this case the sequence of layers in the current confinement structure will be opposite compared to that described above;

(2) The structure as described herein for current confinement relates to lasers having current confinement structures of both n-p-n-p-type and n-SI-n-p-type; the latter variant is of particularly large importance for such lasers which are monolithically integrated with other components, for which a semi-insulating InP-layer is needed to electrically insulate different functions on the same chip from each other, and in order to reduce the capacitance and thereby obtain components which can be modulated at higher bit rates;

(3) The structure as described herein for current confinement is based on another physical mechanism and on another layer structure than that previously known. Herein bending of bands is used which arises from the introduction of a layer sequence comprising in a preferred embodiment N periods of p-InP/p-InGaAsP on the p-side, immediately above a topmost n-layer in a conventional current blocking area. The bending of bands is equivalent to an increased differential resistance and a higher voltage drop resulting therefrom. The mechanism used in the cited patent is that one or more layers of InGaAsP is or are respectively introduced within one of the base and collector layers in the p-n-p-n-thyristor structure which is formed by the current confinement layers together with the bottom and top layers, in order to reduce the lifetime of charge carriers and thereby reduce the current gain factor in the thyristor.

Even if the structure for current confinement as described herein and the previously known structure thus as viewed superficially can appear to be similar, both the exact layer structure and the purpose of providing the layer structure substantially differ from each other. The structure for current confinement as described herein is more general and can, as will be shown hereinafter, also be used for improving lasers having semi-isolating current confinement layers. Further, it can be observed that the introduction of the layer structure on the p-side is a clear advantage in the case where a material system comprising InP/InGaAsP is used since the discontinuity in the bandgap is larger in the valence band than in the conduction band, what results in a larger bending of bands than if a corresponding layer structure had been arranged on the n-side (i.e., the substrate side).

A semiconductor laser thus generally comprises an active region such as a buried heterostructure and current confinement regions surrounding the active region laterally. A top layer and a bottom layer surround the active region in the height direction or transversely, i.e., perpendicularly to the layers and large surface of the structure. The current confinement regions and the top and bottom layers form together an n-p-n-p-structure or an n-SI-n-p-structure actually making the current confinement. One or more thin layers are placed between the second n-doped layer and the second p-doped layer in the structure for current confinement. The thin layers increase the forward voltage drop in the current confinement structure and thereby reduce leakage of current outside the active region.

The laser thus comprises a lateral current blocking structure which is constituted of an n-p-n-p- or n-SI-n-p-sequence of layers, located on both sides of a buried active region. The thin, extra layers are p-doped and consist of alternatingly materials having a high bandgap and a low bandgap. They result a larger forward voltage drop at moderate to high current densities compared to a laser not having such extra layers and thereby give a better current confinement in the laser. This in turn gives a higher optical output power and a smaller deviation of the output power/current characteristic of the laser from a linear behaviour.

Additional objects and advantages of the invention will be set forth in the description which follows, and in part will be obvious from the description, or may be learned by practice of the invention. The objects and advantages of the invention may be realized and obtained by means of the methods, processes, instrumentalities and combinations particularly pointed out in the appended claims.

BRIEF DESCRIPTION OF THE DRAWINGS

While the novel features of the invention are set forth with particularly in the appended claims, a complete understanding of the invention, both as to organization and content, and of the above and other features thereof may be gained from and the invention will be better appreciated from a consideration of the following detailed description of non-limiting embodiments presented hereinbelow with reference to the accompanying drawings, in which:

DETAILED DESCRIPTION

Figure 1:
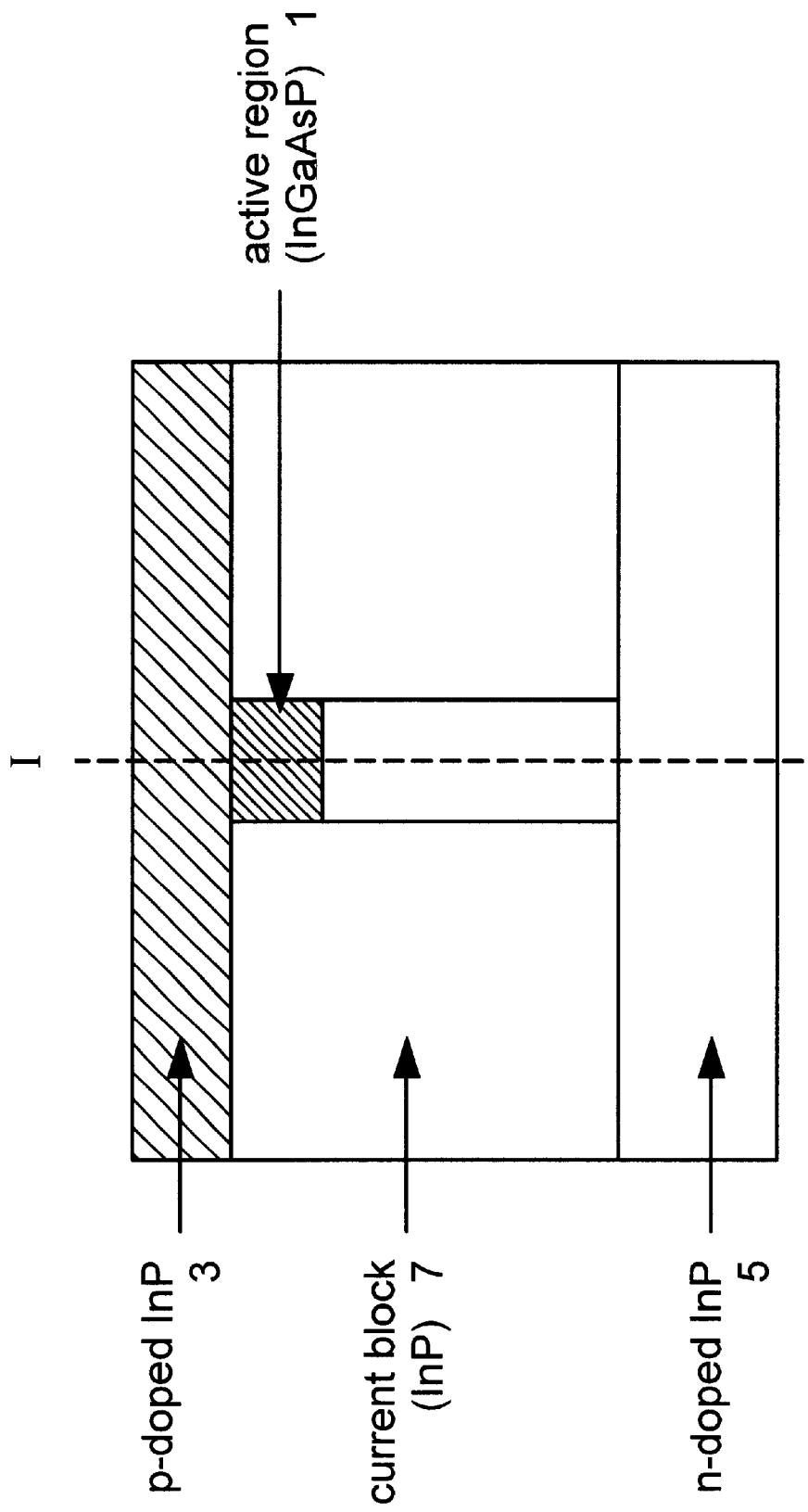
FIG. 1 is a schematic cross-sectional view of a conventional BH-laser diode, the cross-section being taken perpendicularly to the propagation direction of light.
Figure 2:
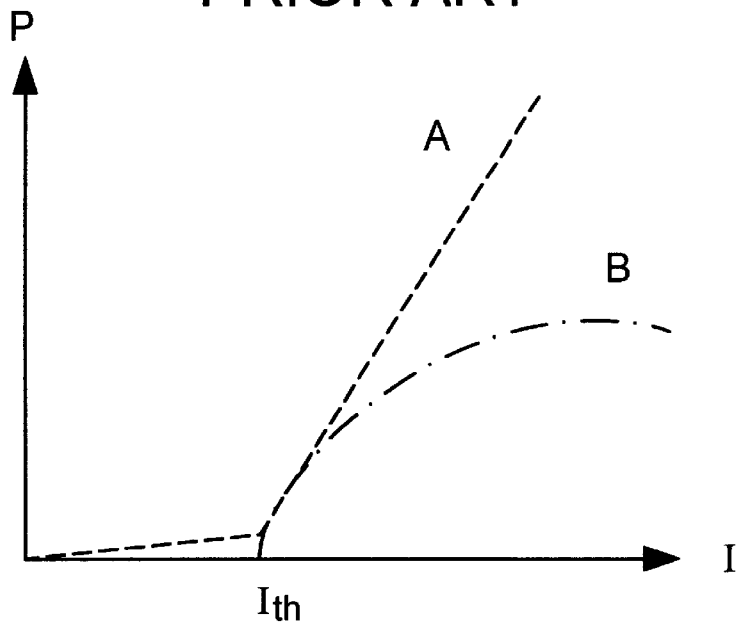
FIG. 2 is a diagram of the optical output power P, measured in mW, as a function of the current I, measured in mA, through a semiconducting laser, where the curve A corresponds to an ideal laser having no current leakage and not being excessively heated and the curve B corresponds to a laser having current leakage at high currents/voltages.
Figure 3:
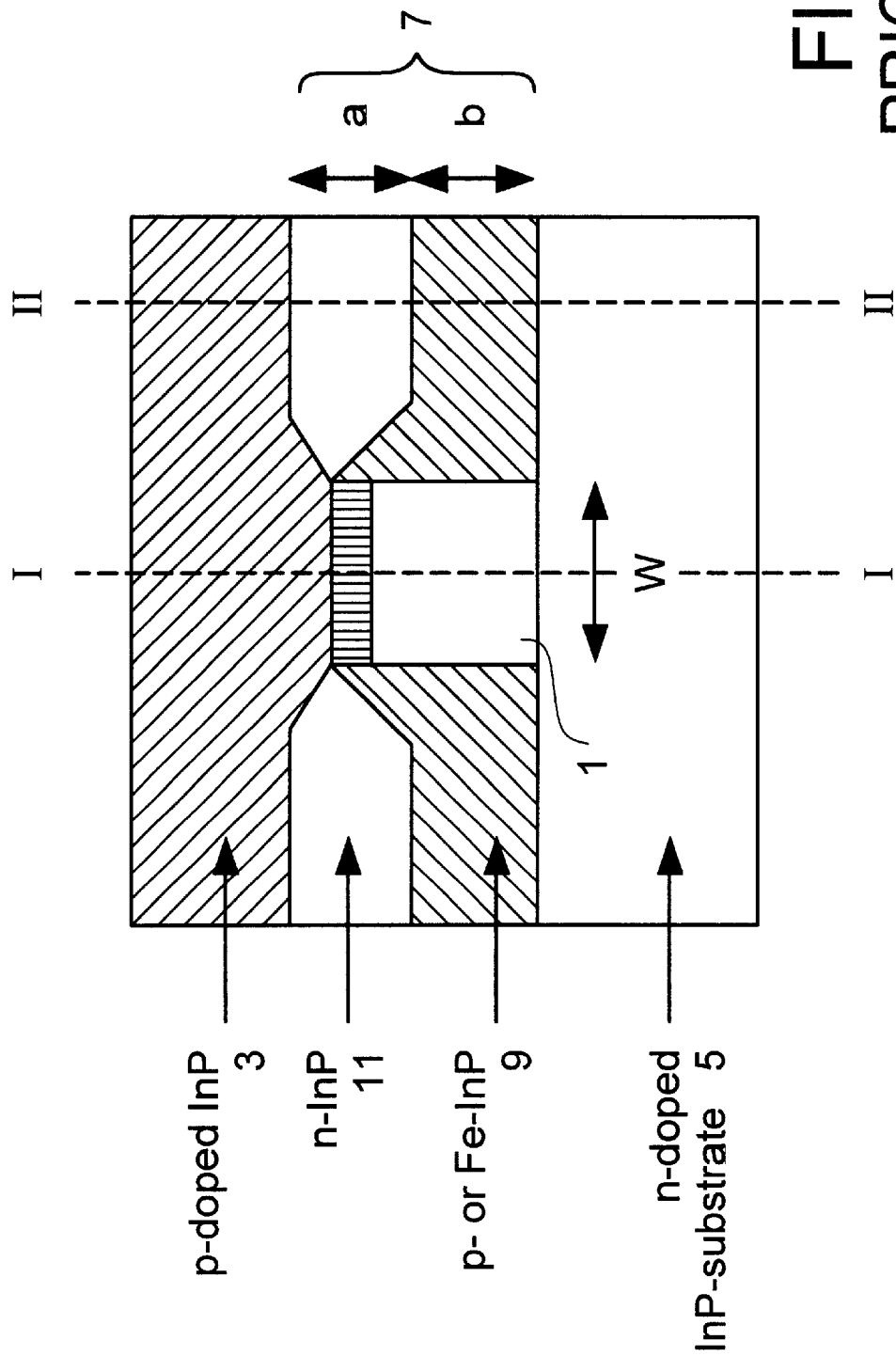
FIG. 3 is a schematic cross-sectional view similar to FIG. 1 which in some more details illustrates the conventional construction of current blocking layers in a BH-laser built in InP/InGaAsP.

The basic construction of a conventional BH-laser has been described with reference to FIG. 1 and its power-current-characteristic is given by FIG. 2. Such a known BH-laser is also illustrated in FIG. 3, from which also the construction of the current confining regions 7 appears. The laser is in the following assumed to be primarily manufactured on an InP-substrate or bottom layer 5, which has a bandgap of about 1.35 eV and it is further assumed that the current blocking layers 7 as well as the layer 3 above the active region 1 also consist of InP having different types of doping, as appears from the structure illustrated in FIG. 1, and that the active region 1 consists of either a single layer of InGaAsP having a thickness of typically 0.05 μm–0.30 μm or a sequence of layers having different compositions containing InP and InGaAs and/or InGaAsP, some layers of which can be very thin for producing, in the known way, a so called multiple quantum well structure. However, the laser diode can also be produced in other similar material systems such as GaAs/AlGaAs, GaAs/InGaAs or InP/InGaAlAs.

Lasers of this type are particularly important for communication using optical fibers using light of the wavelength intervals of about 1.3 μm and 1.55 μm.

The basic technique for manufacturing BH-lasers in these material systems is known. There are mainly two well-known ways of making the current blocking regions 7 in FIG. 1:

A) Using a so called thyristor structure, in which the current blocking region consists first of a p-doped InP-layer followed by an n-doped InP-layer.

B) Using semi-isolating (SI) InP, e.g., InP doped with iron Fe, followed by an ndoped InP-layer.

In the transversal cross-sectional view of a BH-laser as shown in greater detail in FIG. 3 it appears that the laser can be manufactured by means of growing using MOVPE, on the bottom layer 5, i.e., the n-doped substrate, that or those different layers which are included in the active region 1, etching for producing the active region 1 to obtain a mesa or projecting elongated platform having a width w of typically 1–2 μm and thereupon selectively growing the current confinement layers 7 by means of a suitable mask which also can have been used in the previous etching. The case A) as described above corresponds to a p-doped InP-layer 9 closest to the n-substrate 5, which layer surrounds the active region 1 at all the side surfaces thereof and can also cover the upper surface of this region, whereas the case B) as described above corresponds to a Fe-doped InP-layer closest to the n-substrate 5. On top of the layer 9 the n-doped InP-layer 11 is provided, which however does not need to have a direct contact with the layers in the active region 1 but is only located at the side thereof. A typical thickness of the lower layer 9 in the current blocking region 8 is b=0.05–3 μm and a typical thickness of the top layer 11 therein is a=0.05–1.5 μm. At the top of the structure the top p-doped InP-layer 3 is arranged which is located directly on top of the upper current confinement layer 11 at regions at the sides of the active region 1 and in a direct contact with the lower current blocking layer 9 on top of the active region 1.

The total current block or current confinement laterally then consists of either A) lateral n-p-n-p-structures of thyristor type as counted from the bottom, which are located at the sides of the active region 1, or B) n-SI-n-p-structures, see the material sequence obtained at the line or section II—II.

In the case A) the current confinement is effected by the fact that the forward voltage drop is larger in the lateral n-p-n-p-thyristor structure than in the centrally located n-i-p-diode structure, see the structure along the line I—I in FIG. 3, so that all electrical current is ideally conducted through the active region 1 in the center. In the case B) the current confinement works by capturing electrons, which are injected from the substrate into the SI-layer 9, in traps resulting from the Fe-doping. In order to stop injection of holes from above the SI-layer is often combined with an n-doped InP-layer 11 located thereon, as illustrated in FIG. 3.

In many contexts the structure B) is to be preferred to A), since it results in a lower capacitance and hence a larger modulation bandwidth of the component. The use of SI-layers also makes it possible that different portions of an InP-chip can be electrically insulated from each other, what can be used for producing monolithically integrated optical and/or optoelectronic circuits.

A problem in the two structure types is, as has already been mentioned, that they are not ideal. For high currents through the laser some portion of the electric current will still pass through the lateral current blocking structure. The reason therefor is among other things that the voltage drop over the active region 1 and the p-doped layer 3 located closest thereabove is so large that is comparable to the forward voltage drop of the current blocking structure.

In order to improve the blocking capability of the current blocking layers it is thus desirable that the forward voltage drop thereof should be as large as possible.

The conventional current blocking structure of FIG. 3, irrespectively if it applies to the A- or B-variant, is for this purpose supplemented with one or more thin layers placed on top of the top layer in the current confinement region 7, i.e., on top of the n-doped InP-layer 11. The thin layers should generally have a doping opposite that of the underlying layer 11 and thus be p-doped, and they should consist of alternatingly materials having larger bandgaps such as InP and lower bandgaps such as InGaAsP which has bandgaps of 0.9–1.1 eV. These thin layers give larger forward voltage drops at moderate to high current densities of the n-p-n-p or n-SI-n-p structure which are obtained from the current blocking layers 9, 11 together with the substrate 5 and the top layer 3, and thereby a better current confinement of the component, which in turn gives a higher optical output power and a smaller deviation of the P-I-characteristic from a linear behaviour. An increased forward voltage drop in these confinement structures results primarily from a bending of the energy bands obtained due to the layer/layers having lower bandgaps at moderate to high currents.

Figures 4A, 4B:
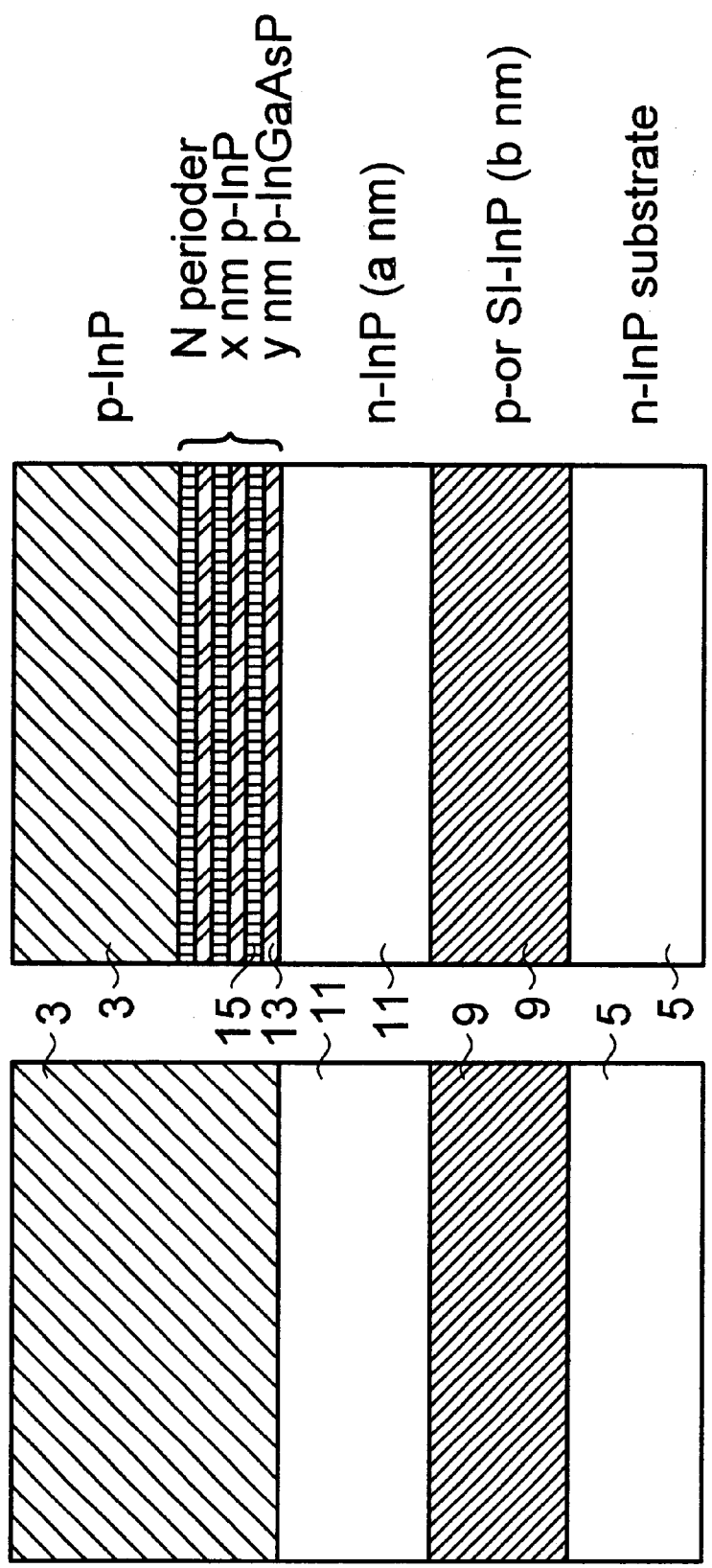
FIGS. 4A and 4B are schematic pictures of the current blocking structure in the section II—II in FIG. 3 for a conventional construction and for a construction comprising thin layers respectively, one of the thin layers having a lower bandgap.

In FIG. 4A a conventional current blocking structure is schematically illustrated, and in FIG. 4B a current blocking structure for enhanced current confinement made according to the description above, in which the structure corresponds to the section II—II in FIG. 3. In the embodiment illustrated in FIG. 4B three periods are provided, in which each period comprises at the bottom a p-doped InGaAsP-layer having a thickness of y nm and thereon a p-doped InP-layer 15 having a thickness of x nm. The number N of periods can vary as well as the exact thicknesses x, y of the thin layers 13, 15 added here and the thicknesses a and b of the two underlying layers 9, 11 in the current blocking region 7. Typical values of the n- and p-dopings in the layers 13, 15 are of the magnitude of $5 \cdot 10^{17}$ cm$^{-3}$ to $2 \cdot 10^{18}$ cm$^{-3}$, but can in the general case adopt both lower and higher values.

Components having a lasing wavelength about 1.51 $\mu$m were manufactured comprising current confinement structures according to FIGS. 4A and 4B. The same wafer was used, on which a conventional laser structure having quantum wells in its active region was grown in a conventional way. Before growing the current blocking layers the wafer was divided in two halves: on one half current blocking layers according to FIG. 4A were grown, i.e., according to the conventional method, and on the other half blocking layers were grown for producing the structure illustrated in FIG. 4B. The thicknesses of the layers were: x=30 nm, y=30 nm, a=0.4 $\mu$m and b=1.3 $\mu$m. The number of periods was N=3. The InGaAsP-layer 13 had a bandgap of 0.96 eV. The next to lowest layer 9, the current blocking layer, which is located directly above the n-substrate 5, consisted of semi-insulating InP doped with iron (Fe).

Figure 5:
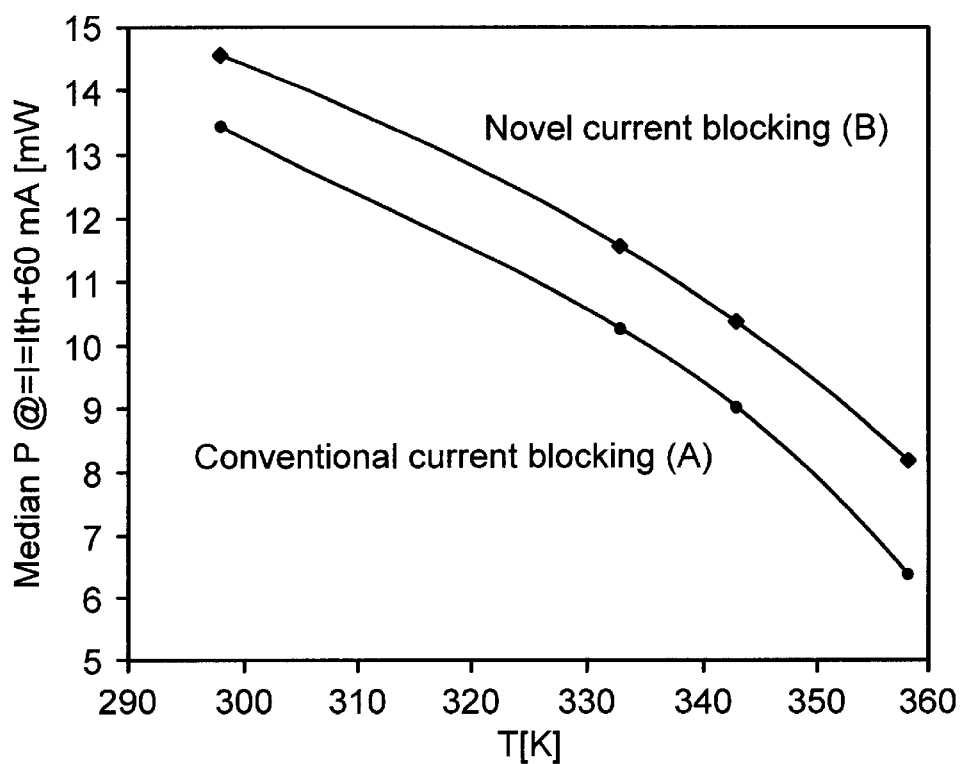
FIG. 5 is a diagram which at the curve A shows the measured output power as a function of the temperature for lasers having a conventional current blocking structure and at the curve B shows the same power for the structure having thin extra layers for current confinement.

The diagram in FIG. 5 shows measured output power calculated as the median value for 15 lasers at 60 mA above the threshold current as a function of the temperature of the chip for the two different variants of the current blocking layers. As appears from FIG. 5 the current blocking structure having a sequence of added thin layers 13, 15 results in substantially improved performance, i.e., a higher output power, in particular at high temperatures.

Figure 6:
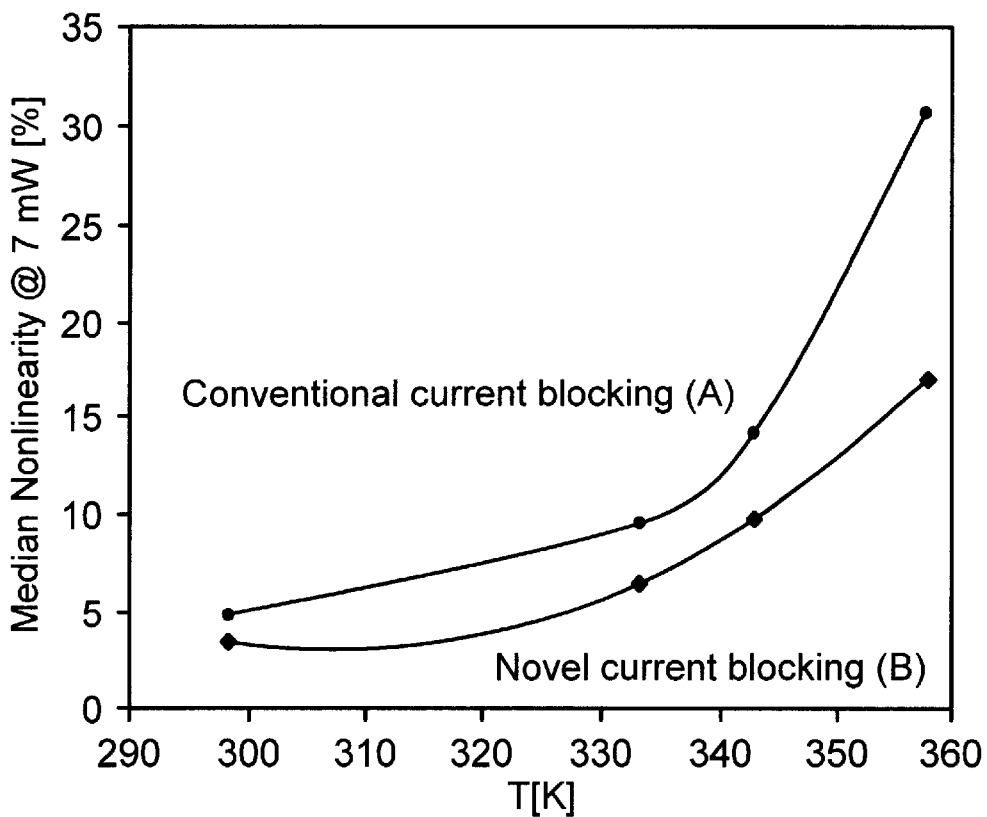
FIG. 6 is a diagram which at the curves A and B shows the measured non-linearity of the curves of the output power as a function of the current for an output power of 7 mW from one side of the laser chip for lasers having a conventional current confinement structure and for laser structures having thin extra layers for current confinement respectively.

The diagram in FIG. 6 illustrates the non-linearity of the P-I-characteristic of the two different lasers. The non-linearity is here defined by first calculating the current which would be required for obtaining an output power of 7 mW, provided that the P-I-curve would follow the linear curve "A" in FIG. 2, starting from the measured threshold current and the measured slope (quantum efficiency) for currents near the threshold current. This current is called $I_1$. Then the magnitude of the output power is measured which is actually obtained at this current $I_1$, the component then following a measured curve similar to the curve "B" in FIG. 2. This measured output power is called $P_1$. Then the quotient of the difference (7 mW–$P_1$) and 7 mW is calculated. This quotient, recalculated to per cent, is here called the non-linearity. Again, a strong improvement is observed for current confinement reinforced with several periods of thin layers as described herein compared to conventional current confinement, in particular at high chip temperatures.

The fact, that the performance of the lasers is much better using the enhanced current confinement at high temperatures of the chips, is particularly important, since lasers for applications within access networks (so called "Fibre to the Home") and for optical internal connection (in e.g., computers of telephone switches) must be capable of working at high temperatures (up to 350–360 K), since a cooling function which was to be used in a capsule comprising a laser according to the above would result in extra components resulting in too high costs of such systems.

In order to verify that the basic idea in introducing one or several (N) periods of thin layers on the p-InP-side in accordance with FIG. 4B really results in a larger voltage drop in the current blocking layer, the current(I)-voltage(U)-characteristics of the two structures illustrated in FIGS. 4A and 4B have been simulated.

Instead of simulating the complete thyristor structure it was chosen to study the influence of the extra layers on the p-side in greater detail by simulating the n-p-diode structure corresponding to only the two upper layers 11, 3 illustrated in FIG. 4A and to these layers including the thin intermediate layers 13, 15 as illustrated in FIG. 4B respectively. Thus, the structure in the latter case consisted of n-doped InP at the bottom, followed by N periods of 280 Å p-doped InP and 280 Å p-doped InGaAsP, followed by p-doped InP. All dopings were $1 \cdot 10^{18}$ cm$^{-3}$. The InGaAsP-material had a bandgap of 0.96 eV and was lattice adjusted to InP.

Figure 7:
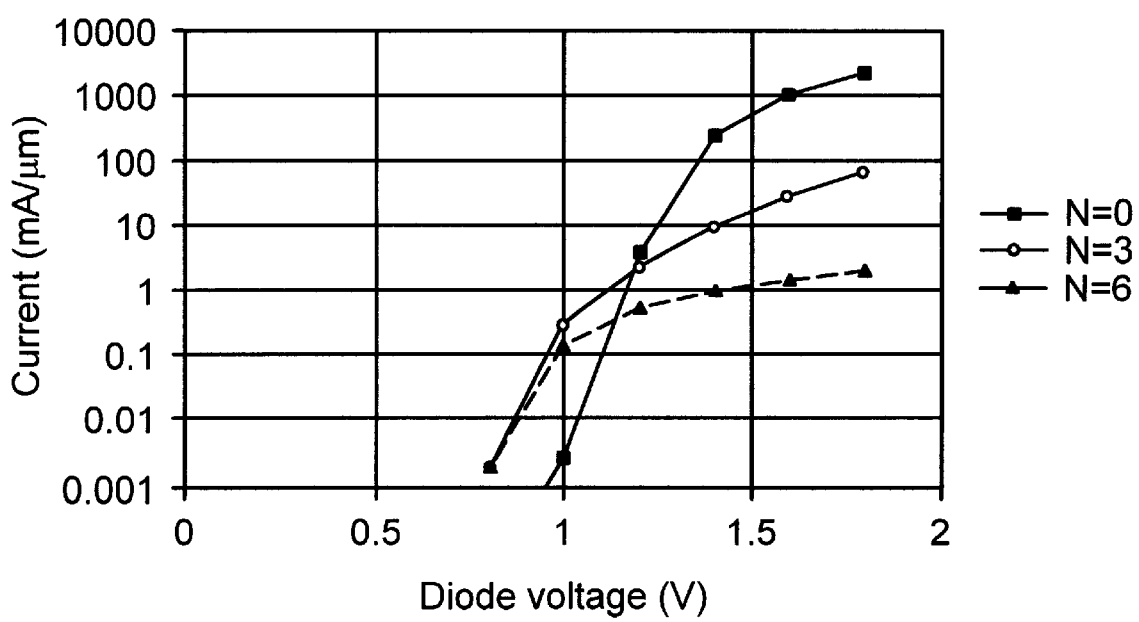
FIG. 7 is a diagram, showing curves of simulated current intensities for a width of 1 micrometer of a diode including no extra layers (N=0) and including (N=3, 6) thin extra layers for current confinement respectively.

In the diagram in FIG. 7 the current is shown for a width of 1 micrometer (1 $\mu$m) for a structure according to the description above having a length of 300 $\mu$m as a function of the electric voltage over the structure. As appears from FIG. 7, the forward voltage drop increases drastically for currents larger than 1 mA/1 $\mu$m by introducing the structure as proposed above comprising additional current confinement layers. The increased forward voltage drop of the current blocking structure means that more current instead passes through the active region 1 (in the section I—I in FIGS. 1 and 3) and that the laser obtains better performance.

While specific embodiments of the invention have been illustrated and described herein, it is realized that numerous additional advantages, modifications and changes will readily occur to those skilled in the art. Therefore, the invention in its broader aspects is not limited to the specific details, representative devices and illustrated examples shown and described herein. Accordingly, various modifications may be made without departing from the spirit or scope of the general inventive concept as defined by the appended claims and their equivalents. It is therefore to be understood that the appended claims are intended to cover all such modifications and changes as fall within a true spirit and scope of the invention.

What is claimed is:

1. A semiconductor laser comprising an active region formed by a buried heterostructure, the semiconductor laser further comprising current confinement regions laterally surrounding the active region and the semiconductor laser further comprising a top layer and a bottom layer, the top layer and the bottom layer transversely surrounding the active region, the current confinement regions and the top layer and the bottom layer together forming one of a n-p-n-p-structure and a n-SI-n-p-structure for current confinement, wherein SI designates a semi-isolating material and the semiconductor laser comprises at least one thin layer placed between a second n-doped layer and a second p-doped layer in the one of the n-p-n-p-structure and the n-SI-n-p-structure for current confinement in order to increase a forward voltage drop in the one of the n-p-n-p-structure and the n-SI-n-p-structure for current confinement and thereby reduce leakage of electrical current outside the active region.

2. The semiconductor laser of claim 1, wherein the at least one thin layer is p doped.

3. The semiconductor laser of claim 1, wherein the at least one thin layer comprises at least two layers, the at least two layers comprising materials having alternatingly higher bandgaps and lower bandgaps.

4. The semiconductor laser of claim 1, wherein at least one of the at least one thin layer comprises a material having a lower bandgap than surrounding layers.

5. The semiconductor laser of claim 1, wherein the semiconductor laser is manufactured on an n-InP-substrate.

6. The semiconductor laser of claim 1, comprising at least one of p-doped, n-doped, and Fe-doped layers of InP and alloys of InGaAsP.

* * * * *